United States Patent [19]
Brettman et al.

[11] 3,970,902
[45] July 20, 1976

[54] HOUSING ARRANGEMENT FOR MINIATURIZED ELECTRONIC DEVICES

[75] Inventors: William M. Brettman, Margate; David L. White, Launderhill, both of Fla.

[73] Assignee: Motorola, Inc., Schaumburg, Ill.

[22] Filed: Mar. 13, 1975

[21] Appl. No.: 558,044

[52] U.S. Cl. .............................. 317/120; 317/101 F
[51] Int. Cl.² .......................................... H05K 7/06
[58] Field of Search ........ 317/101 R, 101 F, 101 D, 317/101 CP, 120; 339/17 F; 134/52 R; 220/306, 307; 206/511

[56] References Cited
UNITED STATES PATENTS

| | | | |
|---|---|---|---|
| 3,780,353 | 12/1973 | Gordon | 317/101 F |
| 3,873,889 | 3/1975 | Leyba | 317/101 R |
| 3,904,074 | 9/1975 | Hoffman | 220/306 |

*Primary Examiner*—Gerald P. Tolin
*Attorney, Agent, or Firm*—Margaret M. Parker; James W. Gillman

[57] ABSTRACT

An improved miniaturized housing arrangement is disclosed for releasably mounting a chassis, such as a printed circuit board, using the contours and the resiliency of the housing itself to retain and release the board. No special tools are required nor any added hardware. The mounting arrangement captivates only small edge portions of the printed circuit board so as to avoid using valuable space on the board that may be devoted to circuitry and the like. The PC board is also fixedly connected to circuitry provided on a nonrigid base ("flex circuit"). The flex circuit is intended primarily for electrical interconnection but also provides a hinge capability for the board when the latter is released. A strain relief device releasably retains the flex circuit within the housing and prevents damage during hingeing action.

3 Claims, 3 Drawing Figures

U.S. Patent     July 20, 1976     3,970,902
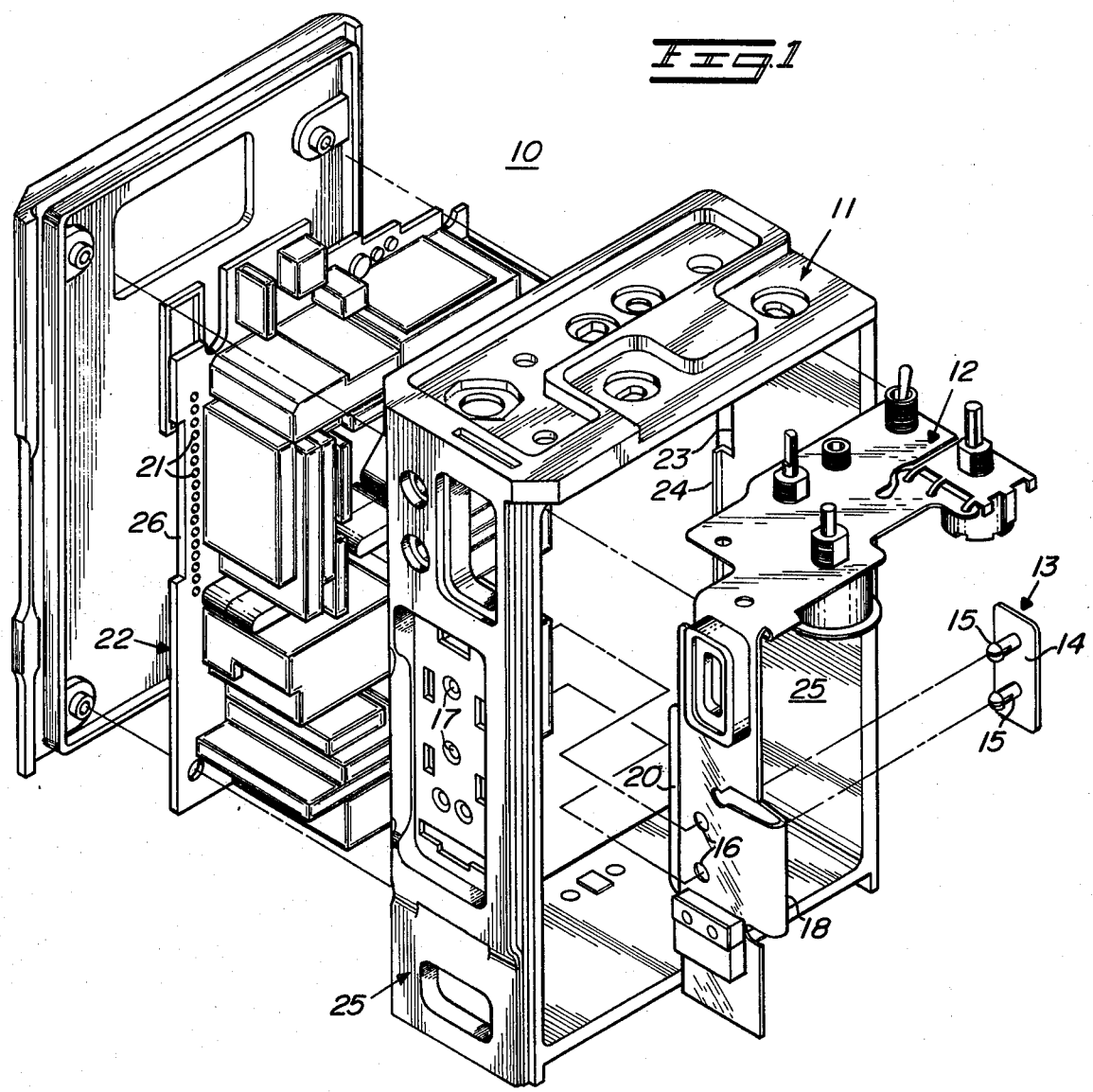
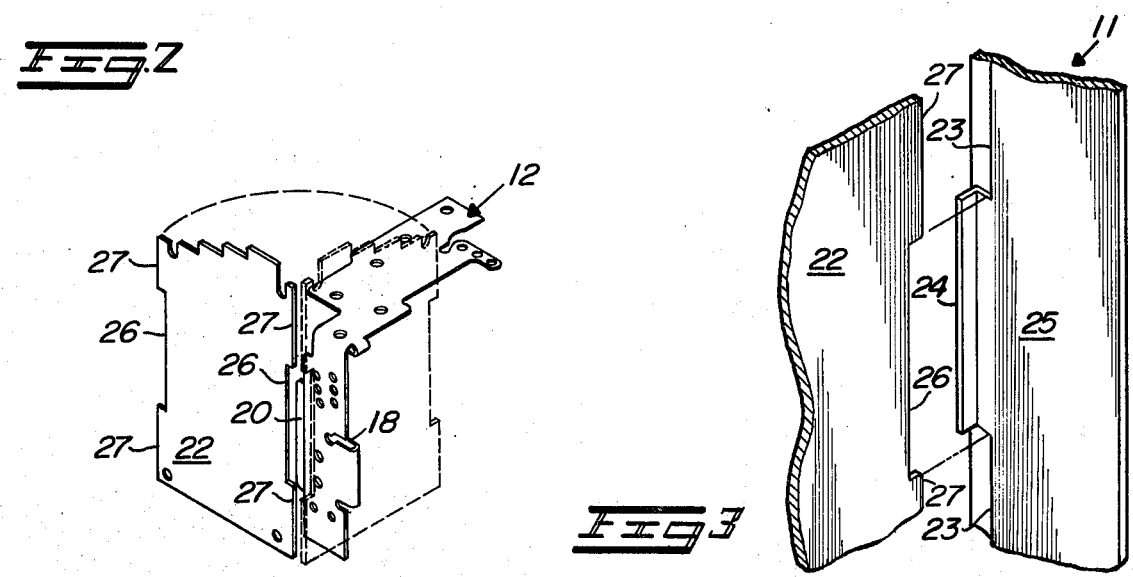

HOUSING ARRANGEMENT FOR MINIATURIZED ELECTRONIC DEVICES

BACKGROUND OF THE INVENTION

1. Field of the Invention

This invention relates to the field of electronic devices wherein components such as flexible circuits and printed circuit boards are used. More specifically, it relates to an improved housing arrangement for attachably mounting a chassis, such as a printed circuit board therein without special tools or additional hardware and without using up valuable space on the printed circuit board.

2. Prior Art

Printed circuit boards or other types of rigid insulating bases serving as chassis for small components in prior devices have typically been mounted in one of several ways: perhaps the most common has been the use of small screws or other type improved of fastener which pass through the board and was fastened by threads or some similar means to a part of the housing. Other devices were permanently fastened to the housing and held the board by tension devices or by screws which pass through the base. Another widely used technique was using the springs which function as electrical contacts as retaining devices also. All of these have problems; small parts which can be easily lost when detached, tension devices which weaken with time and use and electrical contacts which become fatigued and thus vary in conductivity. All of them lack the desired ability to provide access to both sides of the board for servicing, etc., without loosing electrical connection with components not on the board. The board is also more susceptible to damage when completely separated from the housing. And, of particular importance in very small devices, is a conservation of space on the board.

SUMMARY OF THE INVENTION

It is therefore a general object of the invention to provide an improved housing arrangement which overcomes the foregoing deficiencies.

It is a specific object of the invention to use a minimum of space on the board merely for mounting the board.

It is another specific object of the invention to provide electrical continuity while the board is released for servicing, to protect the electrical connections from undue strain or damage during servicing, and to use no easily lost parts.

In practicing the invention a housing suitable for retaining a chassis, such as a printed circuit board, is formed from a firm but resilient material, e.g. polycarbonate, and includes recessed shoulders and projecting portions which cooperate to retain the printed circuit board after the housing is flexed to receive it. No additional hardware or special tools are required. When it is desired to gain access to the inner side of the board for servicing or other purposes, the housing is easily flexed with only finger pressure, releasing the board. To provide hingeing capability concidentally with electrical connection, the board is fastened firmly to a portion of a flex circuit mounted within the housing. Thus, when the board is released from the housing, it can swing out to a position essentially normal to its retained position while electrical continuity is maintained between the components on the board and the flexible circuit. A strain relief device holds the flexible circuit in place and in alignment within the housing, effectively balancing the strain on and preventing damage to the electrical connections.

BRIEF DESCRIPTION OF THE DRAWING

FIG. 1 is a partial exploded perspective view of electrical apparatus incorporating the improved housing arrangement of the present invention.

FIG. 2 is a perspective view showing the hingeing action between a printed circuit board serving as a chassis and an associated flex circuit included as part of the electrical apparatus of FIG. 1.

FIG. 3 is an enlarged partial view in perspective showing a detail of mounting and retaining the chassis board within the apparatus housing.

DETAILED DESCRIPTION OF THE INVENTION

Referring now to the drawings, a partial exploded view of a portable hand-held, two-ray radio communications unit 10 is depicted in FIG. 1, which radio may be considered as typical of the miniaturized electrical or electronic apparatus which may advantageously utilize the present invention. The radio apparatus 10 includes a housig structure 11 a circuit arrangement having a non-rigid base, hereinafter referred to as a "flex circuit" and identified generally as 12, which is retained within the housing 11 by the action of a fastener 13. This fastener relieves strain on the other electrical connections to the flex circuit. Fastener 13 preferably includes a one-piece Delrin base 14 with large-ended, slotted protrusions 15 extending laterally from one face thereof and which are adapted to pass through suitable apertures provided in the flex circuit 12 which protrusions are releaseably retained by the housing 11. However, any means of releasably retaining the flex circuit in position and in alignment within the housing would fall within the spirit and scope of the invention. Retention of the flex circuit is by means of apertures 16 in the flex circuit and apertures 17 in the housing. The enlarged ends of the protrusions 15 are larger in diameter than the apertures 16 and 17. Thus the protrusions are necessarily compressed as they pass through the apertures, then expand again for retention. An extended portion 18 of the flex circuit 12 is normally folded back over the main body of the flex circuit. An outer end 20 of the extended portion 18 is firmly attached to terminals 21 of a printed circuit board 22 for electrical and mechanical contact.

FIG. 2 shows the spatial relationship of the printed circuit board 22 and the flex circuit 12 as it would be when the board has been released from the housing 11, and (dotted in) as it would be when the board is held in its normal operating position within the housing.

FIG. 3 shows a detail of the mounting of the printed circuit board 22 within the housing 11. The housing is made of a strong resilient material such as polycarbonate, and is formed with recessed shoulders 23 and projecting portions 24. For insertion of the board 22, the board is placed against the housing 11, the sides 25 of the housing are flexed outwardly and, simultaneously, pressure is applied to the board. Indented portions 26 of the board are thus enabled to pass the projecting portions 24 but nonindented edges 27 of the board 22 are stopped by the shoulders 23 of the housing. Thus while the entire length of the two longitudinal sides of the board are held firmly between the projections 24 and the shoulders 23 of the housing, a minimum of space on the board is used for mounting.

The operation of the invention, then, involves the cooperation of the above-described elements to provide an arrangement for mounting a printed circuit board within a housing. This mounting accepts and retains the board by the shape and flexibility of the housing, using no hardware and requiring no tools. The board is hinged so that when released from the housing it can be swung out to provide access to its innerside without being disconnected electrically, since the "hinge" is itself a portion of the flex circuit which connects the components on the board with those off the board. The hinge portion of the flex circuit is formed of a flap which folds back over the main part of the circuit, thus it can provide rotation through more than 90° for the pivot circuit board when it is released from the housing. It is highly desirable, however, to provide strain relief for the flexible circuit when it is used in this way. This function is provided by the fastener which releasably holds the flex circuit in place and in alignment. This fastener is positioned to absorb a maximum amount of strain and relieve strain on all of the electrical connections to the flexible circuit.

While particular embodiments of the present invention have been shown and described herein, it will be apparent to those skilled in the art that various changes and modifications may be made without departing from the invention in its broader aspects. As a consequence, the aim in the appended claims is to cover all such changes and modifications as may fall within the true spirit and scope fo the invention.

What is claimed is:

1. An improved housing arrangement for miniaturized electrical apparatus, comprising in combination:

a housing formed of a resilient material with open front and back faces, the housing including shoulders formed along opposing side walls thereof with offset tab portions extending laterally inwardly;

a rigid base chassis for retaining associated electrical components thereon and having a plurality of connection terminals, the chassis having edge portions overlying and resting upon said housing shoulders, the chassis further including notched portions receiving said housing tab portions and maintaining the chassis within the housing and in contact with the shoulders;

a flexible circuit member having a non-rigid base and serving to effect electrical interconnections, the flexible circuit member including connector means interconnecting to the plurality of connection terminals on the rigid base chassis, the connector means hingeing the rigid base chassis to the housing; and strain relief means for the flexible circuit member, including snap-in, retainer means releasably securing a portion of the flexible circuit member to a side of the housing.

2. The housing arrangement according to claim 1 wherein the strain relief means comprises a flat resilient base and at least two integral resilient rod members extending outwardly from one surface of the flat base, each rod member having an enlarged, slotted end.

3. A housing arrangement according to claim 2 and wherein the flexible circuit member is formed with one aperture for each rod member, said circuit apertures accommodating the rod members, and wherein the housing is formed with one aperture for each rod member, said housing apertures resisting the release of the enlarged ends of the rod members, said rod members extending through said housing apertures.

* * * * *